United States Patent
Mostoller et al.

(10) Patent No.: US 7,850,466 B2
(45) Date of Patent: Dec. 14, 2010

(54) THROUGH BOARD INVERTED CONNECTOR

(75) Inventors: Matthew Mostoller, Hummelstown, PA (US); Christopher George Daily, Harrisburg, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 12/512,760

(22) Filed: Jul. 30, 2009

(65) Prior Publication Data

US 2009/0317990 A1    Dec. 24, 2009

Related U.S. Application Data

(63) Continuation-in-part of application No. 12/144,241, filed on Jun. 23, 2008, now Pat. No. 7,704,082.

(51) Int. Cl.
*H01R 12/00* (2006.01)

(52) U.S. Cl. ........................................................ 439/83

(58) Field of Classification Search ............. 439/78–83
See application file for complete search history.

(56) References Cited

U.S. PATENT DOCUMENTS

| | | | |
|---|---|---|---|
| 5,197,891 A * | 3/1993 | Tanigawa et al. ............... | 439/83 |
| 5,823,801 A * | 10/1998 | Elkhatib ........................ | 439/83 |
| 6,089,902 A | 7/2000 | Daoud | |
| 6,190,210 B1 | 2/2001 | Belopolsky et al. | |
| 6,287,130 B1 | 9/2001 | Torii | |
| 6,558,205 B1 | 5/2003 | Shi et al. | |
| 6,733,319 B1 | 5/2004 | Jørgensen | |
| 6,848,950 B2 | 2/2005 | Allison et al. | |
| 6,848,953 B2 | 2/2005 | Schell et al. | |
| 7,220,141 B2 | 5/2007 | Daily et al. | |
| 7,258,562 B2 | 8/2007 | Daily et al. | |
| 7,261,579 B2 | 8/2007 | Ku et al. | |
| 7,374,436 B2 | 5/2008 | Schell et al. | |
| 7,402,064 B2 | 7/2008 | Daily et al. | |
| 7,452,249 B2 | 11/2008 | Daily et al. | |
| 7,458,839 B2 | 12/2008 | Ngo et al. | |
| 7,470,160 B1 | 12/2008 | Mostoller et al. | |
| 7,513,793 B2 | 4/2009 | Horst et al. | |
| 7,540,761 B2 | 6/2009 | Weber et al. | |
| 7,547,214 B2 | 6/2009 | Duesterhoeft et al. | |
| 2002/0098743 A1 | 7/2002 | Schell et al. | |
| 2003/0181106 A1 | 9/2003 | Schell et al. | |
| 2005/0136713 A1 | 6/2005 | Schell et al. | |
| 2005/0181643 A1 | 8/2005 | Brower et al. | |
| 2006/0003620 A1 | 1/2006 | Daily et al. | |
| 2006/0189194 A1 | 8/2006 | Daily et al. | |
| 2006/0228927 A1 | 10/2006 | Daily et al. | |
| 2006/0258123 A1 | 11/2006 | Forbes | |
| 2006/0258213 A1 | 11/2006 | Ku et al. | |
| 2006/0281354 A1 | 12/2006 | Ngo et al. | |

(Continued)

*Primary Examiner*—Briggitte R Hammond

(57) ABSTRACT

A connector assembly includes a housing and a contact. The housing extends from a front end to an opposite back end. The housing includes an interior chamber inwardly extending from the front end that is configured to receive a mating connector through the front end of the housing. The contact is joined with the housing and extends between a mating end and a mounting surface. The mating end is configured to engage a mating contact of the mating connector. The mounting surface is configured to be mounted to a substrate to electrically couple the mating connector with the substrate. The housing extends through an opening in the substrate such that the housing protrudes from opposite sides of the substrate.

22 Claims, 11 Drawing Sheets

U.S. PATENT DOCUMENTS

| | | |
|---|---|---|
| 2007/0202748 A1 | 8/2007 | Daily et al. |
| 2008/0153344 A1 | 6/2008 | Horst et al. |
| 2008/0182439 A1 | 7/2008 | Schell et al. |
| 2008/0214027 A1 | 9/2008 | Schell et al. |
| 2008/0274641 A1 | 11/2008 | Weber et al. |
| 2009/0075519 A1 | 3/2009 | Daily et al. |
| 2009/0130889 A1 | 5/2009 | Daily et al. |

* cited by examiner

THROUGH BOARD INVERTED CONNECTOR

CROSS-REFERENCE TO RELATED APPLICATIONS

This application is a continuation-in-part of co-pending U.S. patent application Ser. No. 12/144,241 (the "'241 Application"). The '241 Application was filed on Jun. 23, 2008, and is entitled "Through Board Inverted Connector." The entire disclosure of the '241 Application is incorporated by reference herein in its entirety.

BACKGROUND OF THE INVENTION

The subject matter herein relates generally to electrical connectors, and more particularly, to surface mounted electrical connectors.

Many known connectors are mounted on a top side of a circuit board and protrude upward from the circuit board. These connectors include electrical contacts that are electrically connected to conductive traces in the circuit board or to wires that extend along the surface and/or sides of the circuit board. The connectors have a mating interface configured to mate with a mating connector such as a plug connector or a card module. The mating interface typically is located parallel or perpendicular with respect to the top side of the circuit board.

Some of these known connectors may have a height profile above the top side of the circuit board that is top large for certain applications. For example, the profile of some connectors used in conjunction with light emitting diodes ("LEDs") may be so large relative to the LEDs that the connectors impede or block some of the light emitted by the LEDs. Additionally, the trend toward smaller electronic devices and more densely packed electronic devices and connectors on a circuit board requires the reduction of the height profile for connectors.

A need exists for a connector having a smaller profile than known connectors. Such a connector may be useful in devices where a smaller connector height profile is desired, such as in LED lighting devices.

BRIEF DESCRIPTION OF THE INVENTION

In one embodiment, a connector assembly, is provided. The connector assembly includes a housing and a contact. The housing extends from a front end to an opposite back end. The housing includes an interior chamber inwardly extending from the front end that is configured to receive a mating connector through the front end of the housing. The contact is joined with the housing and extends between a mating end and a mounting surface. The mating end is configured to engage a mating contact of the mating connector. The mounting surface is configured to be mounted to a substrate to electrically couple the mating connector with the substrate. The housing extends through an opening in the substrate such that the housing protrudes from opposite sides of the substrate.

In another embodiment, another connector assembly is provided. The connector assembly includes a housing and a contact. The housing extends from a front end to an opposite back end. The housing includes a card slot inwardly extending from the front end that is configured to receive a card module through the front end of the housing. The contact is joined with the housing and extends between a mating end and a mounting surface. The mating end is configured to engage a mating contact of the card module. The mounting surface is configured to be mounted to a substrate to electrically couple the card module with the substrate. The housing extends through an opening in the substrate such that the housing protrudes from opposite sides of the substrate.

In another embodiment, another connector assembly is provided. The connector assembly includes a housing and a contact. The housing extends from a front end to an opposite back end. The housing includes an interior chamber inwardly extending from the front end that is configured to receive a mating connector through the front end of the housing. The contact is joined with the housing and extends between a mating end disposed within the interior chamber and a mounting surface disposed outside of the housing. The mating end is configured to engage a mating contact of the mating connector in the interior chamber. The mounting surface is configured to be mounted to a substrate to electrically couple the mating connector with the substrate. The housing extends through an opening in the substrate such that the housing protrudes away from each of opposite sides of the substrate.

DETAILED DESCRIPTION OF THE INVENTION

Figure 1:
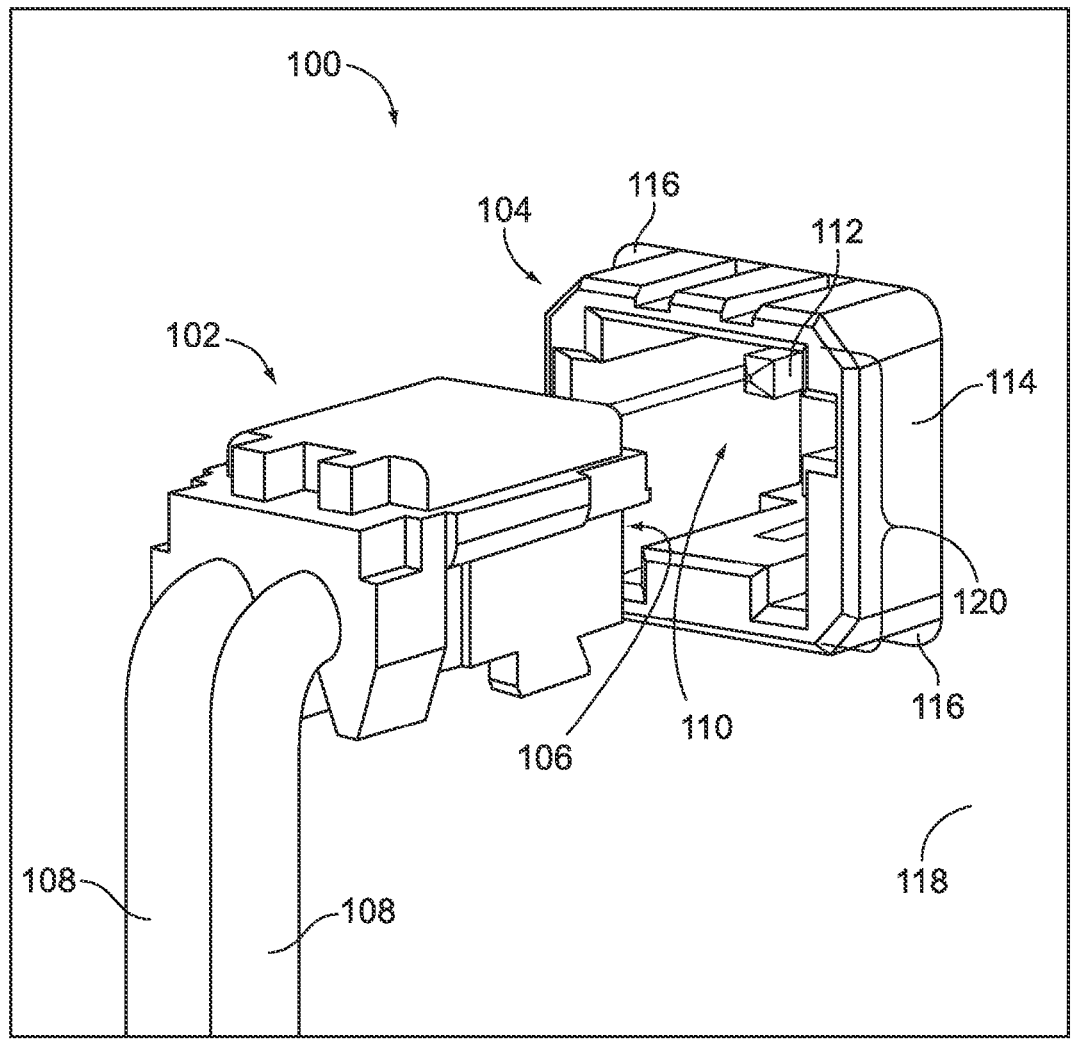
FIG. 1 is a front perspective view of a connector system in accordance with one embodiment.

FIG. 1 is a front perspective view of a connector system 100 in accordance with one embodiment. The connector system 100 includes a mating connector 102 and a connector assembly 104. The mating connector 102 is shaped to be inserted into, and thus mate with, the connector assembly 104 in the illustrated embodiment. In another embodiment, the mating connector 102 may be shaped to receive the connector assembly 104. The mating connector 102 includes a plug end 106 that holds at least one mating contact (not shown). In the illustrated embodiment, the mating connector 102 is cable mounted to a plurality of cables 108 with internal conductors (not shown) that are terminated to the mating contacts in the plug end 106. In an alternative embodiment, the mating connector 102 may be board mounted rather than cable mounted.

The connector assembly 104 includes a housing 114 that partially protrudes through an opening 116 in a substrate 118 in the illustrated embodiment. The substrate 118 is a substantially flat supporting layer that may mechanically support and electrically connect the connector assembly 104 with one or more peripheral devices (not shown) using one or more conductive traces 310 (shown in FIG. 3). For example, the substrate 118 may include a metal clad printed circuit board ("PCB") or an FR4 PCB. Other embodiments of the substrate 118 also may be used in one or more embodiments described herein. In one embodiment, the housing 114 includes and/or is formed from a dielectric material, such as a plastic material. An interior chamber 110 is located in the housing 114 and is shaped to receive the plug end 106 in the illustrated embodiment. The interior chamber 110 extends from a mating interface 120 of the housing 114 inward toward a back end 218 (shown in FIG. 2) of the housing 114. For example, the mating interface 120 may be the front loading side of the housing 114 through which the plug end 106 is loaded. In another embodiment, the mating interface 120 is received by the mating connector 102. In the illustrated embodiment, the housing 114 at least partially protrudes through the opening 116 such that the mating interface 120 is located proximate to and past the substrate 118. In another embodiment, the mating interface 120 is substantially flush with the substrate 118. In another embodiment, the mating interface 120 is partially recessed; in the opening 116. A plurality of contacts 112 are provided in the interior chamber 110. The contacts 112 engage the contacts (not shown) in the plug end 106 when the plug end 106 is inserted into the interior chamber 110. The contacts 112 engage the contacts in the plug end 106 to provide an electrical connection between the mating connector 102 and the connector assembly 104. While one embodiment of the connector assembly 104 is shown in FIG. 1, other types of connectors may be used in accordance with various embodiments described herein.

Figure 2:
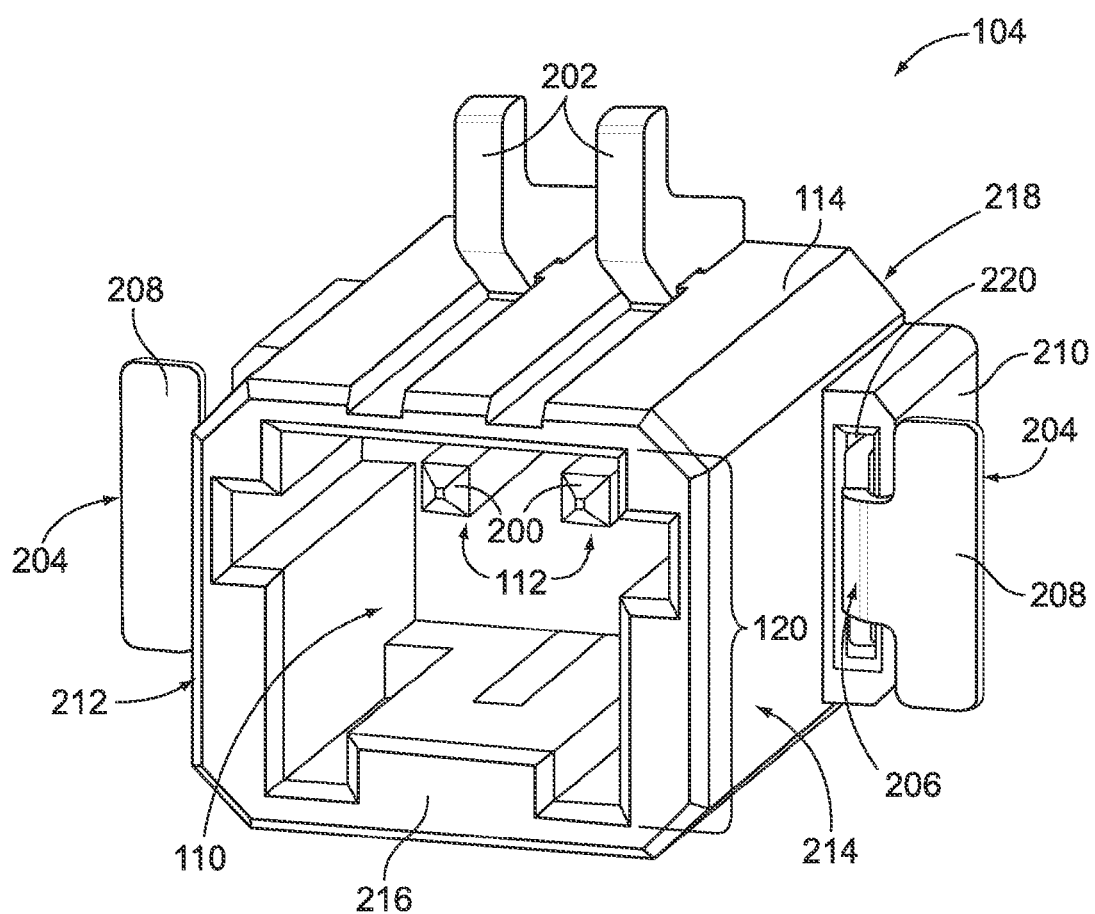
FIG. 2 is a front perspective view of a connector assembly shown in FIG. 1.

FIG. 2 is a front perspective view of the connector assembly 104. As shown in FIG. 2, the housing 114 extends between front and back ends 216, 218, with the mating interface 120 located at the front end 216. Each of the contacts 112 in the connector assembly 104 extends between a mating interface end 200 and a mounting surface 202. While two contacts 112 are shown in the illustrated embodiment, a different number of contacts 112 may be provided. In one embodiment, the mating interface ends 200 are located within the interior chamber 110 of the housing 114 and the mounting surfaces 202 are located external to the interior chamber 110.

A plurality of protrusions 210 extends from opposite sides 212, 214 of the housing 114 and extends from the back end 218 (shown in FIG. 2) of the housing 114 partially toward the mating interface 120 in one embodiment. The protrusions 210 may define a depth of insertion of the housing 114 into the opening 116. For example, the protrusions 210 may limit how far the housing 114 may be inserted into the opening 116. In one embodiment, each of a plurality of tabs 204 extends from one of the protrusions 210. The tabs 204 may be used to mount the connector assembly 104 to the substrate 118 (shown in FIG. 1). For example, the tabs 204 may be soldered or otherwise affixed to the substrate 118 to secure the connector assembly 104 on the substrate 118 and to add additional security to the substrate 118.

Each of the tabs 204 may be formed of a material that is stamped and formed so as to have a bend 206 and a mounting surface 208. For example, the tabs 204 may be stamped and formed from a conductive material such as a metal. Each of the tabs 204 may be connected to the housing 114 by inserting an insertion portion 514 (shown in FIG. 5) of the tabs 204 into corresponding slots 220 of the housing 114, as shown in illustrated embodiment. The slots 220 may be provided within the protrusions 210. The tabs 204 may each include one or more retention barbs 516 (shown in FIG. 5) that are inserted into the slot 220 to secure the tab 204 in the slot 220. The bend 206 is an approximately 90 degree bend in the illustrated embodiment. In another embodiment, the bend 206 is an angle other than 90 degrees. The mounting surfaces 208 may be substantially parallel to the mating interface 120 in one embodiment. In the illustrated embodiment, the mounting surfaces 208 of the tabs 204 and the mounting surfaces 202 of the contacts 112 are substantially coplanar.

Figure 5:
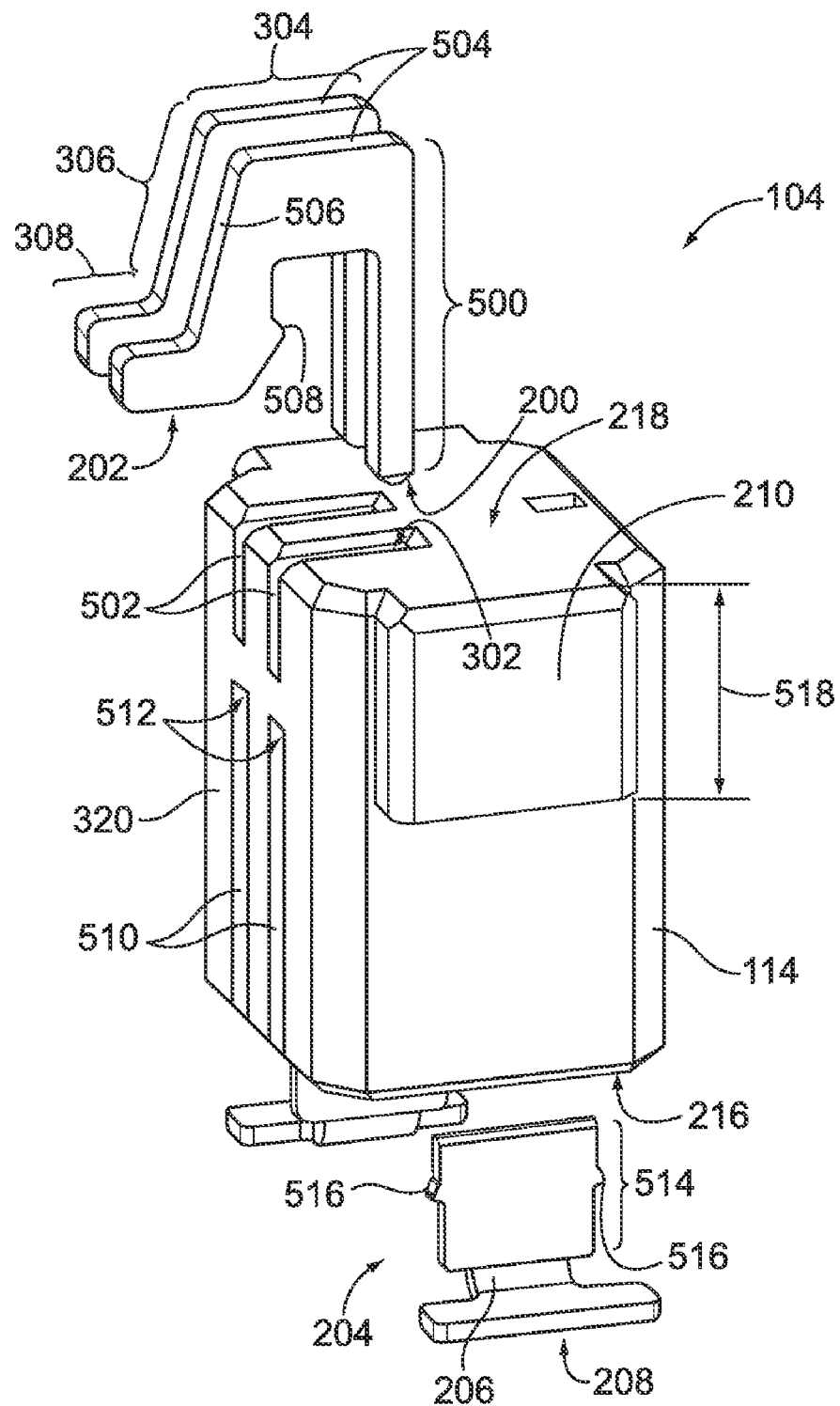
FIG. 5 is an exploded view of the connector assembly shown in FIG. 1.

FIG. 5 is an exploded view of the connector assembly 104. In the illustrated embodiment, each of the contacts 112 includes an insertion portion 500, a flat portion 304, an angled portion 306 and a mounting portion 308. In one or more other embodiments of the contacts 112, the contacts 112 extend between the mating interface end 200 in the interior chamber 110 (shown in FIG. 1) and the mounting surface 202 outside of the interior chamber 110. For example, the contacts 112 may not include one or more of the insertion, flat, angled and mounting portions 500, 304, 306, 308, and/or may be shaped differently that the contacts 112 shown in FIG. 5. The contacts 112 shown in FIG. 5 are merely provided as an example of one embodiment.

In the illustrated embodiment, the insertion portion 500 includes a part, of the contact 112 that is inserted into the interior chamber 110 through an opening 302 in the back end 218 of the housing 114. The insertion portion 500 may extend between the mating interface end 200 and the flat portion 304. The flat portion 304 is received into an upper slot 502 in the back end 218 in the illustrated embodiment. The upper slot 502 may extend along the back end 218 and partially down a side 302 of the housing 114. The flat portion 304 may be received into the upper slot 502 so that a top surface 504 of the flat portion 304 is flush with the back end 218. The flat portion 304 extends between the insertion portion 500 and the angled portion 306. The angled portion 306 includes an angled surface 506 that extends between the mounting portion 308 and the flat portion 304 and along a side 320 of the housing 114. The angled portion 306 may include a retention barb 508 on a side of the angled portion 306 that opposes the angled surface 506. The retention barb 508 may be inserted into a bottom slot 510 in the side 320 in the housing 114. The bottom slot 510 may partially extend from the front end 216 of the housing 114 toward the back end 218. The bottom slot 510 may end at a ledge 512 that provides an engagement surface for the retention barb 508. For example, the contact 112 may be loaded into the bottom slot 510 and the upper slot 502 so that the retention barb 508 engages the ledge 512. The engagement between the retention barb 508 and the ledge 512 may prevent the contact 112 from being removed from the housing 114. The angled portion 306 extends between the flat portion 304 and the mounting portion 308. The mounting portion 308 extends partially away from the angled portion 306. The mounting portion 308 includes the mounting surfaces 202.

As shown in FIG. 5, the tabs 204 include the insertion portion 514 that is connected to the mounting surface 208, with a bend 206 between the insertion portion 514 and the mounting surface 208. The insertion portion 514 in the illustrated embodiment includes the retention barbs 516 on opposite sides of the insertion portion 514. The retention barbs 516 may engage the inside of the slot 220 (shown in FIG. 2) when the insertion portion 514 is inserted into the slot 220 in order to prevent the tab 204 from being removed from the slot 220.

In another embodiment, the tabs 204 are secured in the slots 220 through a press fit connection.

Figure 3:
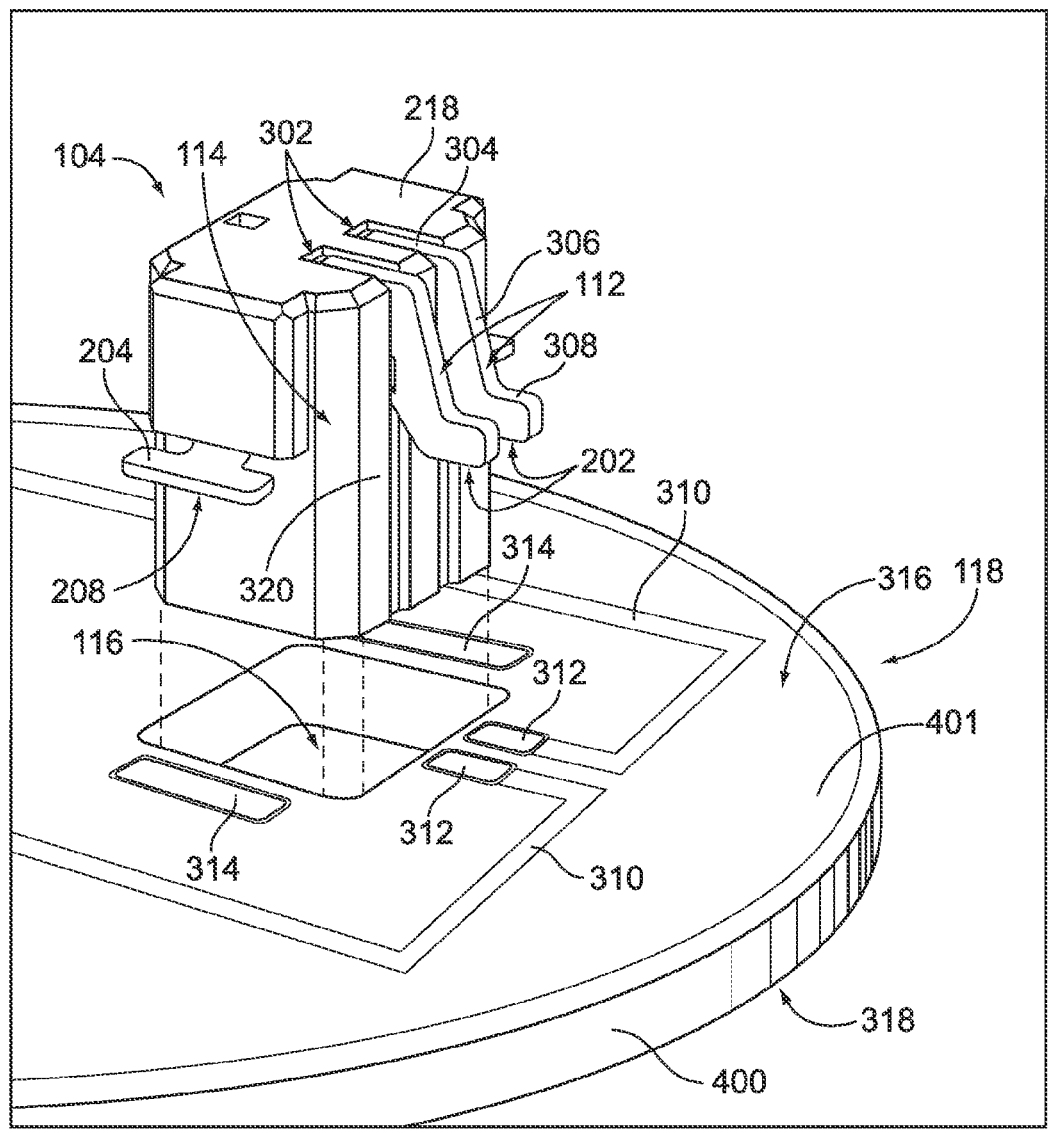
FIG. 3 is a perspective view of the connector assembly shown in FIG. 1 prior to inserting the connector assembly into an opening in a substrate shown in FIG. 1 and prior to mounting the connector assembly to the substrate.

FIG. 3 is a perspective view of the connector assembly 104 prior to inserting the connector assembly 104 into the opening 116 in the substrate 118 and prior to mounting the connector assembly 104 to the substrate 118. As shown in FIG. 3, the substrate 118 may include a plurality of contact pads 312 that are electrically connected to the conductive traces 310. The contact pads 312 may be mating contacts that mate with the connector assembly 104. The contact pads 312 may include and/or be formed from conductive material that is electrically connected to the conductive traces 310. In another embodiment, the contact pads 312 may be portions of the conductive traces 310 that are exposed. In one embodiment, the substrate 118 is a PCB that includes a plurality of layers (not shown) of dielectric material with conductive traces (such as the conductive traces 310) provided in one or more of the layers. In one embodiment, the substrate 118 is a PCB with conductive traces 310 on a mounting side 316 and an opposite side 318 of the substrate 118. In another embodiment, the substrate 118 is a PCB with conductive traces 310 in locations of the substrate 118 that are proximate to the contact pads 312 that are only on the mounting side 316 of the substrate 118. As described above, the substrate 118 may include a metal clad board in one embodiment. For example, the substrate 118 may include a layer 400 of conductive material that is partially enclosed with a layer 400 of nonconductive material. In one embodiment, the substrate 118 is a metal clad board used in lighting devices having one or more LEDs mounted on the mounting side 316 of the substrate 118.

The substrate 118 may include a plurality of mounting pads 314. The mounting pads 314 may include or be formed of a material that can be used to secure the mounting surfaces 208 of the tabs 204 to the substrate 118, as described above. For example, the mounting pads 314 may define solder pads and the mounting surfaces 208 may be soldered to the mounting pads 314.

During assembly, the connector assembly 104 may be physically and electrically connected to the substrate 118 by partially inserting the housing 114 into the opening 116, connecting the mounting surfaces 202 of the contacts 112 to the contact pads 312, and securing the mounting surfaces 208 of the tabs 204 to the mounting pads 314. For example, the connector assembly 104 may be physically connected to the substrate 118 by securing the mounting surfaces 208 of the tabs 204 to the mounting pads 314. By way of example only, the mounting surfaces 208 of the tabs 204 may be secured to the mounting pads 314 by soldering the mounting surfaces 208 and the mounting pads 314 together. As another example, the mounting surfaces 208 may be soldered using hand or surface mount solder methods. As another example, the mounting surfaces 208 may be affixed to the mounting pads 314 using an adhesive material. For example, the mounting surfaces 208 may be secured to the mounting pads 314 using, an epoxy such as a conductive epoxy. The connector assembly 104 may be electrically connected to the substrate 118 by electrically connecting the mounting surfaces 202 of the contacts 112 to the contact pads 312. For example, the mounting surfaces 202 and the contact pads 312 may be soldered together. In one embodiment, the connector assembly 104 is mounted to the substrate 118 on only one side of the substrate 118. For example, the mounting surfaces 202 of the contacts 112 may be connected to the contact pads 312 and the mounting surfaces 208 of the tabs 204 may be secured to the mounting pads 314, with no other mechanical coupling between the connector assembly 104 and substrate 118 being provided.

Figure 4:
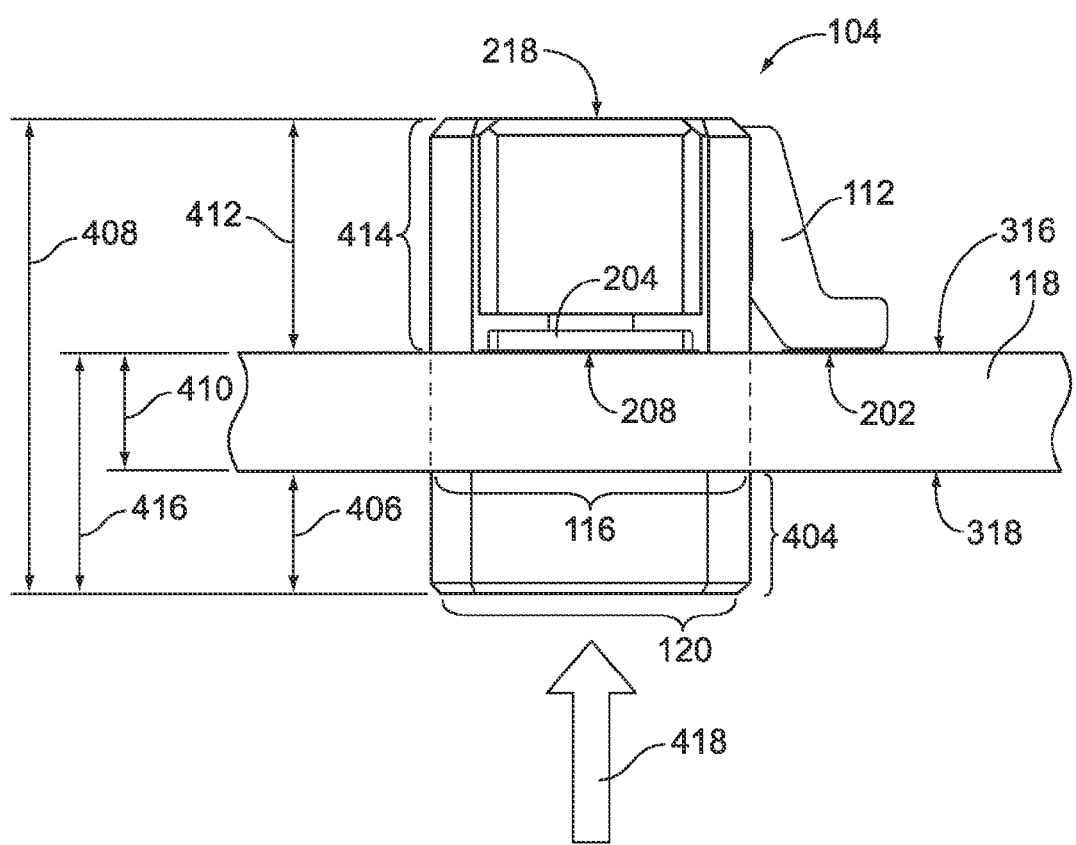
FIG. 4 is a plan view of the connector assembly shown in FIG. 1 mounted to the substrate shown in FIG. 1.

FIG. 4 is a plan view of the connector assembly 104 mounted to the substrate 118. The opening 116 extends between the mounting and opposite sides 316, 318 of the substrate 118. A protruding portion 404 of the housing 114 protrudes through the opening 116 (shown in FIG. 1) in the substrate 118 past the opposite side 318 of the substrate 118. The protruding portion 404 extends between the mating interface 120 and the opposite side 318 when the connector assembly 104 is mounted to the substrate 118. The protruding portion 404 may have a height 406 between the mating interface 120 and the opposite side 318 that represents the distance that the mating interface 120 protrudes through the opening 116. In one embodiment, the height 406 is the distance between the mating interface 120 and the opposite side 318 in a direction that is substantially perpendicular to the mating interface 120 and the opposite side 318. The height 406 may be varied by changing a total height 408 of the connector assembly 104, a thickness 410 of the substrate 118, a height 412 of a mounting side portion 414 of the connector assembly 104, adjusting a height 518 (shown in FIG. 5) of the protrusions 210 (shown in FIG. 2) of the housing 114, and/or adjusting how far the insertion portions 514 (shown in FIG. 5) of the tabs 204 are inserted into the slots 220 (shown in FIG. 2). The height 518 of the protrusions 210 is the distance the protrusions 210 extend away from the back end 218.

The mounting side portion 414 of the connector assembly 104 is the portion of the connector assembly 104 that extends between the mounting side 316 of the substrate 118 and the back end 218 of the housing 114. The height 412 of the mounting side portion 414 is the distance between the back end 218 and the mounting side 316 in a direction that is substantially perpendicular to the back end 218 and the mounting side 316 in one embodiment.

The height 412 of the mounting side portion 414 may be sufficiently small so that the connector assembly 104 defines a low profile connector. For example, the height 412 may be sufficiently small such that an LED positioned proximate to the connector assembly 104 on the mounting side 316 is capable of emitting light beyond the connector assembly 104 without the mounting side portion 414 or the mating connector 102 blocking the light. For example, the height 412 may be sufficiently small such that the back end 218 is located proximate to the mounting side 316 of the substrate 118.

As described above, the mounting surfaces 202, 208 of the contacts 112 and the tabs 204 may be substantially coplanar with one another. The plane in which the mounting surfaces 202, 208 are coplanar with respect to one another may be referred to as a mounting plane. In one embodiment, the mounting plane is coplanar with the mounting side 316. In the embodiment illustrated in FIG. 4, the mounting side 316 also may represent the mounting plane. In another embodiment, the mounting plane may be disposed at an angle with respect to the mounting side 316. For example, the housing 114 (shown in FIG. 1) may be connected to the tabs 204 and the contacts 112 so that the housing 114 is disposed at an angle that is transverse to the mounting side 316 while the mounting surfaces 202, 208 of the contacts 112 and the tabs 204 are substantially coplanar with the mounting side 316. The mating interface 120 may be substantially parallel to the mounting plane. For example, the mating interface 120 may be substantially parallel to the opposite side 318 of the substrate 118 such that the plug end 106 (shown in FIG. 1) of the mating connector 102 (shown in FIG. 1) mates with the connector assembly 104 by moving the plug end 106 relative to the connector assembly 104 along a loading direction 418. The loading direction 418 may be substantially perpendicular to the substrate 118, including the opposite side 318 of the substrate 118. In another embodiment, the mating interface 120 may be disposed at an angle that is transverse to the mounting plane. As described above, the housing 114 may be connected to the tabs 204 and the contacts 112 so that the housing 114 and the mating interface 120 are angled with respect to the mounting side 316 while the mounting surfaces 202, 208 of the contacts 112 and the tabs 204 are substantially coplanar with the mounting side 316.

In the illustrated embodiment, a distance 416 between the mounting plane and the mating interface 120 is greater than the height 406 of the protruding portion 404 so that the mating interface 120 is provided past the opposite side 318. Although not shown in FIG. 4, in another embodiment the mating interface 120 may be recessed within the opening 116. For example, the distance 416 may be less than the thickness 410 of the substrate 118 so that the mating interface 120 is located between the mounting and opposite sides 316, 318 of the substrate 118. The distance 416 is substantially perpendicular to the mating interface 120 in one embodiment. In embodiments where the distance 416 is greater than the height 406, the mating interface 120 protrudes past the opposite side 318. In another embodiment, the distance 416 between the mounting plane and the mating interface 120 is approximately the same as the thickness 410 of the substrate 118. In such an embodiment, the mating interface 120 may be substantially flush with the opposite side 318.

Figure 6:
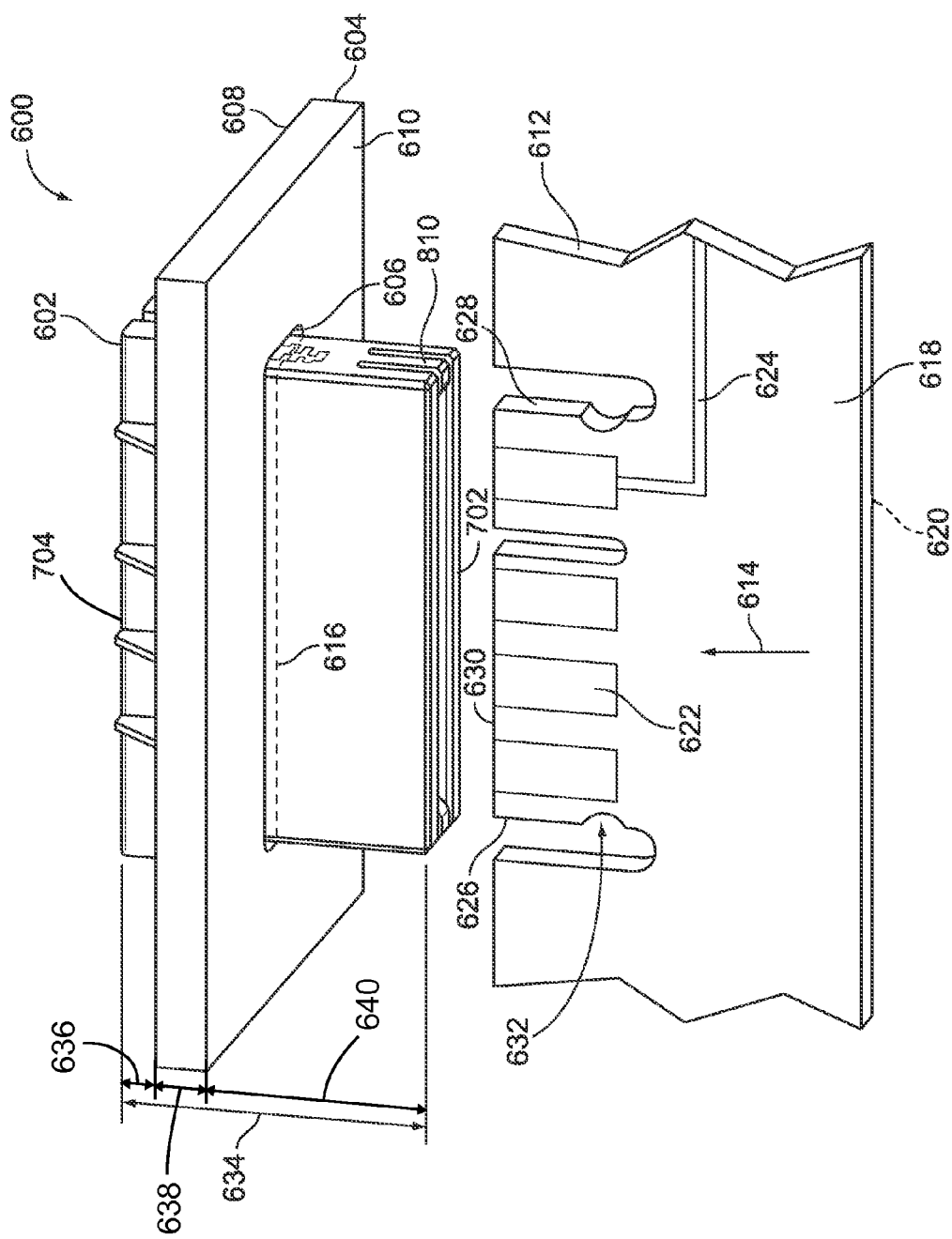
FIG. 6 is a perspective view of a connector system in accordance with another embodiment of the present disclosure.

FIG. 6 is a perspective view of a connector system 600 in accordance with another embodiment of the present disclosure. The connector system 600 may be similar to the embodiment of the connector system 100 that is shown in FIG. 1. For example, the connector system 600 includes a connector assembly 602 that is mounted to a substrate 604 and protrudes through an opening 606 in the substrate 604. The connector assembly 602 extends between a front end 702 to an opposite back end 704. The substrate 604 may be similar to the substrate 118 (shown in FIG. 1). By way of example only, the substrate 604 may be a metal clad PCB or an FR4 PCB. One of the differences between the embodiment of the connector system 600 that is shown in FIG. 6 and the embodiment of the connector system 100 shown in FIG. 1 is that the connector assembly 602 mates with a different mating connector than the mating connector 102 (shown in FIG. 1).

As shown in FIG. 6, the connector assembly 602 is a board-mounted connector that is mounted to one of the sides 608, 610. The connector assembly 602 is disposed within the opening 606 in the substrate 604. Similar to the opening 116 (shown in FIG. 1) of the substrate 118 (shown in FIG. 1), the opening 606 extends through the substrate 604 from one side 608 to an opposite side 610 of the substrate 604. The connector assembly 602 is mounted to one side 608 of the substrate 604 and extends through the opening 606 to outwardly protrude from the opposite side 610 of the substrate 604. The side 608 may be referred to as the mounting side of the substrate 604 as the connector assembly 602 is mounted to the side 608. As shown in FIG. 6, the connector assembly 602 also may outwardly protrude from the side 608 of the substrate 604. For example, the connector assembly 602 may extend through the opening 606 such that the substrate 604 extends around and encloses an outer perimeter 616 of the connector assembly 602. A total height dimension 634 is the distance between the front and back ends 702, 704 of the connector assembly 602. In the illustrated embodiment, the total height dimension 634 is the sum total of a mounting height dimension 636, a substrate thickness dimension 638 and a protruding height, dimension 640. The mounting height dimension 636 is the distance between the back end 704 of the connector assembly 602 and the side 608 of the substrate 604. The substrate thickness dimension 638 is the distance between the opposite sides 608, 610 of the substrate 604. The protruding height dimension 640 is the distance between the side 610 of the substrate 604 and the front end 702.

The connector assembly, 602 mates with a mating connector 612. In the illustrated embodiment; the mating connector 612 is a card module. For example, the mating connector 612 may be a circuit board module that is similar to the substrate 604. The mating connector 612 includes a mating edge 630 that is loaded into the connector assembly 602. The mating connector 612 includes opposite sides 618, 620. One or more of the sides 618, 620 has conductive mating pads 622. The mating pads 622 are mating contacts that comprise conductive sections or portions of the sides 618, 620. The mating pads 622 may be joined with conductive traces 624 that extend through the mating connector 612. The mating connector 612 includes opposite edges 626, 628. In the illustrated embodiment, the edges 626, 628 are interior edges. For example, the edges 626, 628 are not exterior edges of the substrate 604 and are instead provided as slots extending into the mating connector 612 from the mating edge 630. Alternatively, the edges 626, 628 may be exterior edges disposed along outside edges 626, 628 of the mating connector 612. The edges 626, 628 may include retention features 632 that engage or are engaged by the connector assembly 602 to secure the mating connector 612 in a mated relationship with the connector assembly 602. In the illustrated embodiment, the retention features 632 are recesses that inwardly extend into the mating connector 612 from the edges 626, 628. For example, the retention feature 632 in the edge 626 extends into the mating connector 612 in a direction toward the edge 628 and the retention feature 632 of the edge 628 extends into the connector assembly 602 in an opposite direction toward the edge 626. As described below, the retention features 632 may be engaged by latches 810 of the connector assembly 602 to secure the mating connector 612 to the connector assembly 602.

The mating connector 612 is loaded into the connector assembly 602 along a mating direction 614 that is oriented approximately perpendicular to the substrate 604 and extends toward the side 610. For example, the mating connector 612 may be inserted into the connector assembly 602 in a direction toward the side 610 that is opposite to the mounting side 608. The mating connector 612 is perpendicularly oriented with respect to the substrate 604 once the mating connector 612 and connector assembly 602 mate with one another. For example, the substrate 604 and mating connector 612 may be approximately perpendicular to one another once the mating connector 612 mates with the connector assembly 602.

Figure 7:
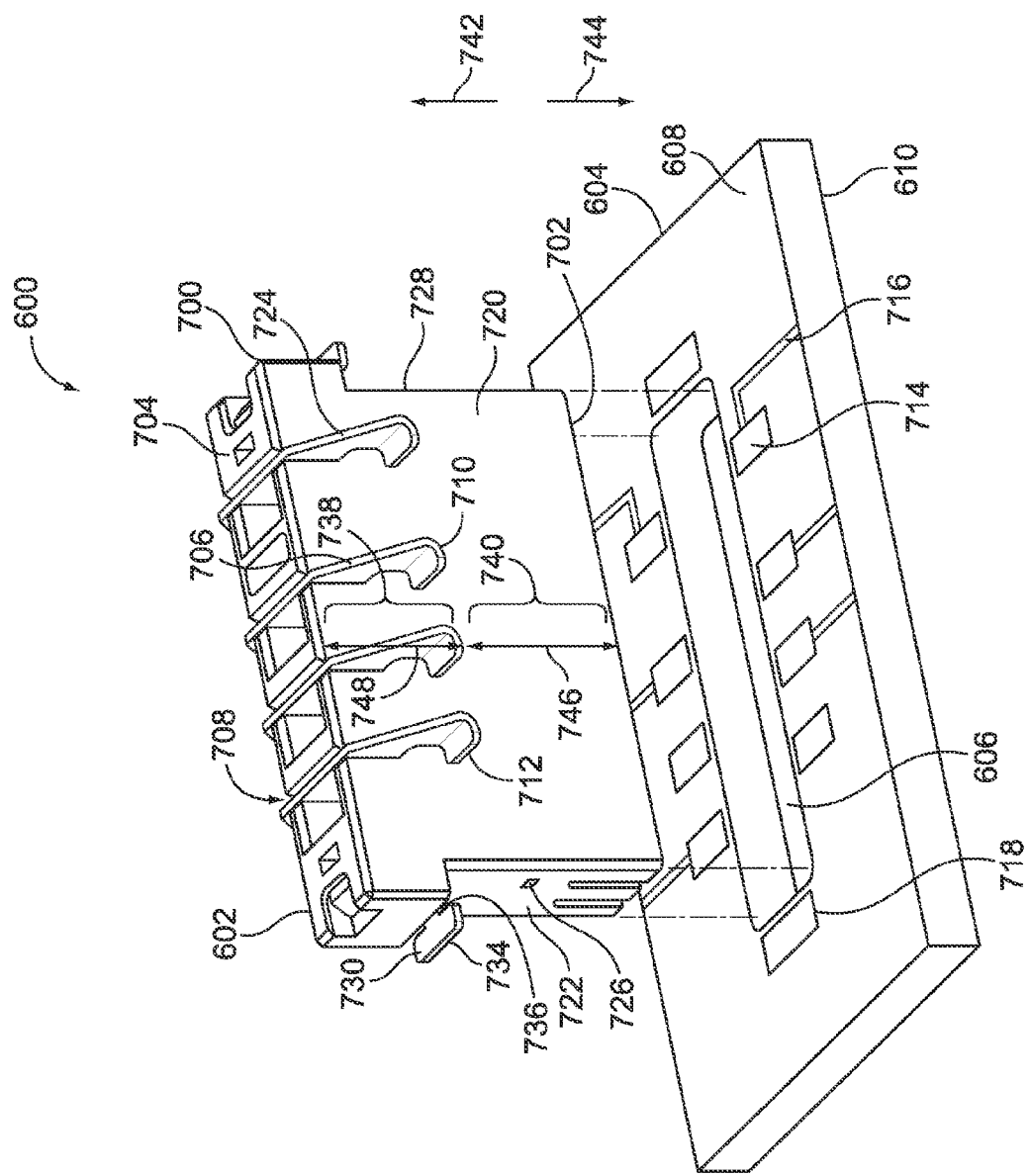
FIG. 7 is an exploded view of the connector system shown in FIG. 6 in accordance with one embodiment of the present disclosure.

FIG. 7 is an exploded view of the connector system 600 in accordance with one embodiment of the present disclosure. The connector assembly 602 includes a housing 700 that extends from the front end 702 to the back end 704. The housing 700 also extends between opposite sides 720, 722 and between opposite sides 726, 728. In the illustrated embodiment, each of the sides 720, 722, 726, 728 intersects both of the front and back ends 702, 704. The housing 700 may be at least partially divided into a protruding portion 740 and a mounting portion 738. The protruding and mounting portions 740, 738 may be similar to the protruding and mounting portions 404, 414 (shown in FIG. 4). For example, when the connector assembly 602 is mounted to the substrate 604, the protruding portion 740 outwardly extends through the opening 606 in one direction 744 that is perpendicularly oriented with respect to the side 610 while the mounting portion 738 outwardly protrudes through the opening 606 in an opposite direction 742 that is perpendicularly oriented with the respect to the side 608. When the connector assembly 602 is mounted to the substrate 604, the protruding portion 740 extends between the front end 702 and the side 610 and has a height 746 between the front end 702 and the side 610. The height 746 represents the distance that the front end 702 protrudes through the opening 606.

The mounting side portion 738 is the portion of the connector assembly 602 that extends between the side 608 of the substrate 604 and the back end 704. A height 748 of the mounting side portion 738 is the distance between the back end 704 and the side 608. The height 748 of the mounting side portion 738 may be sufficiently small so that the connector assembly 602 defines a low profile connector. For example, the height 748 may be sufficiently small such that an LED positioned proximate to the connector system 600 on the side 608 of the substrate 604 is capable of emitting light beyond the connector assembly 602 without the mounting side portion 738 blocking the light. For example, the height 748 may be sufficiently small such that the back end 704 is located proximate to the side 608 of the substrate 604.

The housing 700 may include, or be formed from, a dielectric material, such as one or more polymer materials. The housing 700 includes an interior chamber 800 (shown in FIG. 8) that receives the mating connector 612. For example, the housing 700 may include a card slot that inwardly extends from the front end 702 toward the back end 704 and that receives a card module. The housing 700 receives the mating connector 612 (shown in FIG. 6) through the front end 702 when the connector assembly 602 and the mating connector 612 mate. The housing 700 includes contact slots 708 that are openings downwardly extending from the back end 704 toward the front end 702.

One or more contacts 706 are joined to the housing 700. In the illustrated embodiment, four contacts 706 are shown but the number of contacts 706 provided may vary. The contacts 706 include, or may be formed from, a conductive material such as copper or a copper alloy. In one embodiment, the contacts 706 are stamped and formed from one or more sheets of metal. The contacts 706 are loaded into the contact slots 708 of the housing 700 in order to position the contacts 706 in the housing 700. The contacts 706 extend from corresponding mating ends 906 (shown in FIG. 9) to associated mounting ends 710. The contacts 706 include arms 724 that outwardly extend from the contact slots 708 and downwardly along the opposite sides 720, 722 of the housing 700. The mating ends 906 of the contacts 706 engage the mating connector 612 and the mounting ends 710 engage the substrate 604 when the mating connector 612 mates with the connector assembly 602 to electrically couple the mating connector 612 and the substrate 604. The mounting ends 710 include mounting surfaces 712. In the illustrated embodiment, the mounting surfaces 712 are substantially planar surfaces. The mounting surfaces 712 of the contacts 706 may be approximately coplanar with respect to one another.

The substrate 604 includes contact pads 714 that may be similar to the contact pads 312 (shown in FIG. 3) and conductive traces 716 that may be similar to the conductive traces 310 (shown in FIG. 3). The contact pads 714 and the conductive traces 716 may be electrically coupled with one another. The mounting surfaces 712 of the contacts 706 are mounted to the contact pads 714 to electrically couple the contacts 706 with the conductive traces 716 of the substrate 604. By way of example only, the mounting surfaces 712 may be soldered to the contact pads 714. The contacts 706 may mate with the mating connector 612 to electrically join the mating connector 612 with the substrate 604.

The connector assembly 602 includes tabs 730 joined to the sides 726, 728 of the housing 700. The tabs 730 may be similar to the tabs 204 (shown in FIG. 2) of the connector assembly 104 (shown in FIG. 1). The tabs 730 may be used to mount the connector assembly 602 to the substrate 604. For example, the tabs 730 may be soldered or otherwise affixed to the substrate 604 to secure the connector assembly 602 on the substrate 604. In the illustrated embodiment, the tabs 730 are mounted to the mounting pads 718 of the substrate 604. The tabs 730 may be formed of a material that is stamped and formed so as to have a bend 732 and a mounting surface 734. For example, the tabs 730 may be stamped and formed from a conductive material such as a metal. The tabs 730 may be press fit into the housing 700 in a manner that is similar to the loading of the tabs 204 into the slots 220 (shown in FIG. 2) of the housing 114 (shown in FIG. 1) of the connector assembly 104. The mounting surfaces 734 may be substantially coplanar with the mounting surfaces 712 of the contacts 706.

Figure 8:
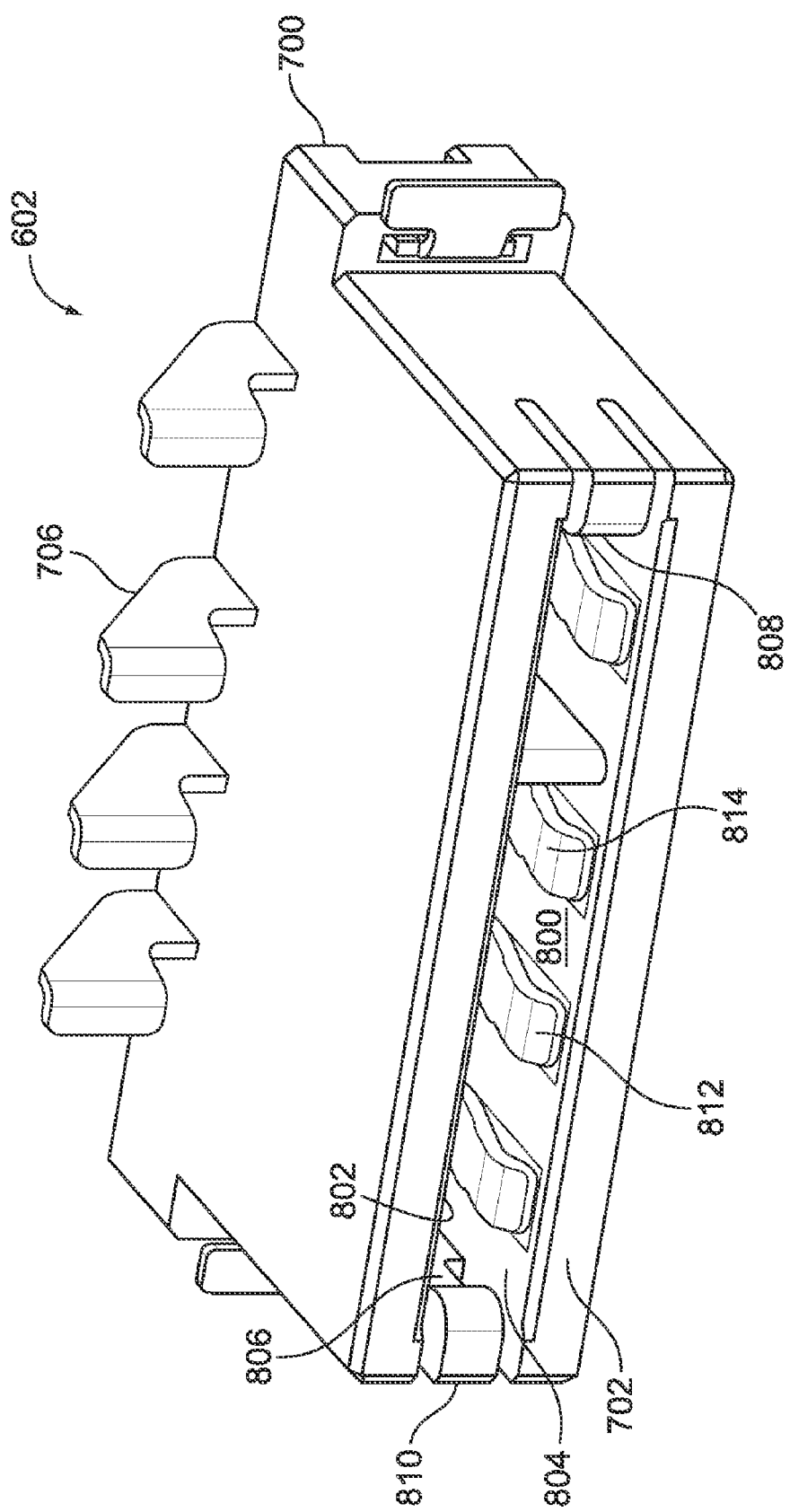
FIG. 8 is a perspective view of a connector assembly shown in FIG. 6 in accordance with one embodiment of the present disclosure.

FIG. 8 is a perspective view of the connector assembly 602 in accordance with one embodiment of the present disclosure. The housing 700 of the connector assembly 602 includes the interior chamber 800 extending inward from the front end 702 of the housing 700. In the illustrated embodiment, the interior chamber 800 defines a card slot that receives a card module as the mating connector 612 (shown in FIG. 6). The housing 700 includes opposing inner walls 802, 804 and opposing inner walls 806, 808. Each of the inner walls 802, 804 intersects both of the inner walls 806, 808 and each of the inner walls 806, 808 intersects both of the inner walls 802, 804 in the illustrated embodiment. The inner walls 806, 808 include the latches 810. The latches 810 may be cantilevered beams joined to the housing 700. The latches 810 may engage the retention features 632 (shown in FIG. 6) of the mating connector 612 to secure the mating connector 612 in a mated relationship with the connector assembly 602. For example, the latches 810 may engage the retention features 632 to secure the card module in the interior chamber 800. The latches 810 may slightly bias outward away from one another and provide a spring force against the mating connector 612 when the mating connector 612 is loaded into the interior chamber 800.

Figure 9:
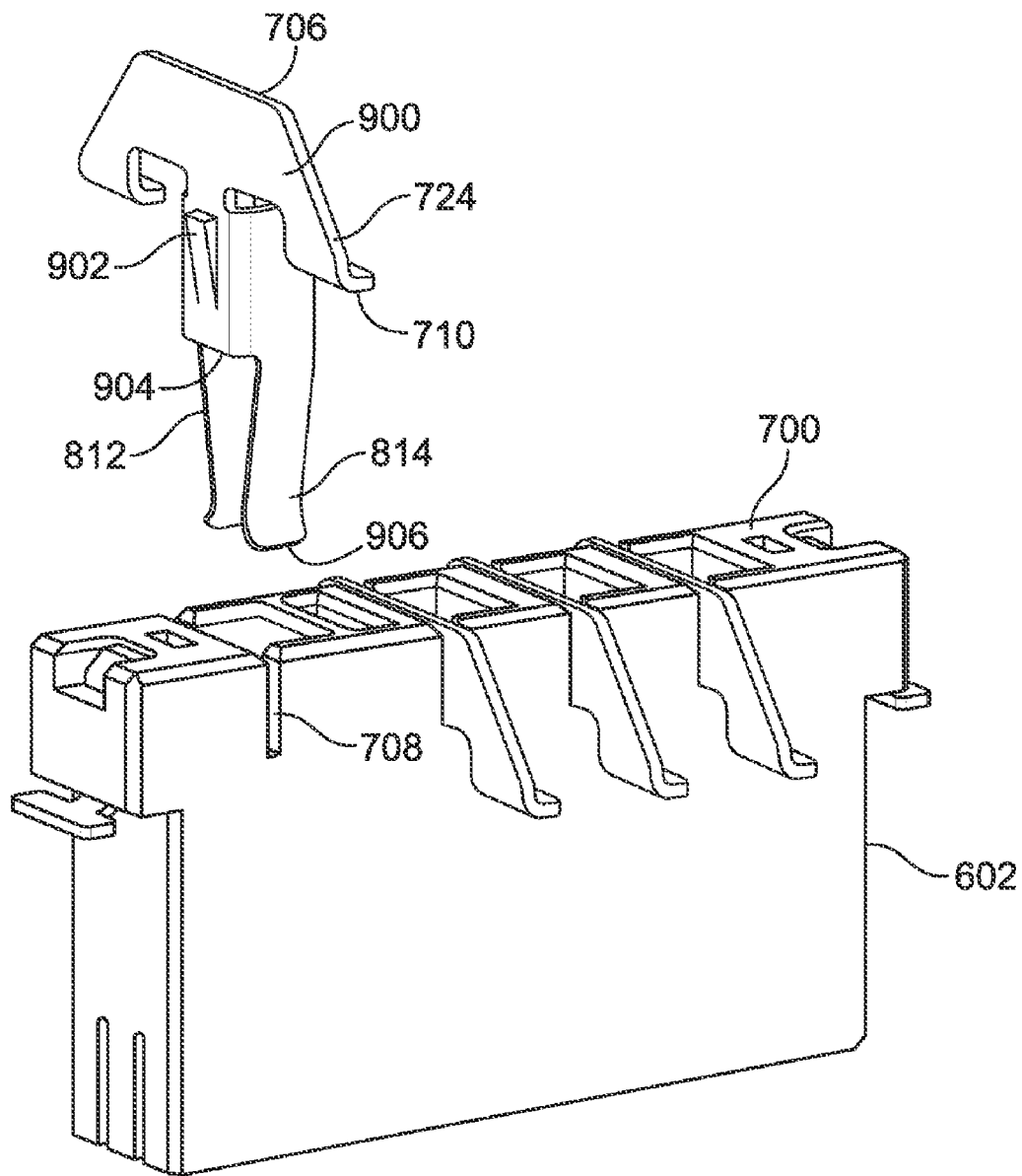
FIG. 9 is an exploded view of the connector assembly shown in FIG. 6 in accordance with one embodiment of the present disclosure.

With continued reference to FIG. 8, FIG. 9 is an exploded view of the connector assembly 602 in accordance with one embodiment of the present disclosure. The contacts 706 include opposing contact beams 812 that are joined to a mounting body 900. The contact beams 812 extend from the mounting body to the outer mating ends 906. The mounting body 900 is loaded into the slot 708 in the housing 700 to orient and hold the contact 706 in the housing 700. The mounting body 900 includes the arms 724 extending in opposite directions from one another. The arms 724 are received in the slot 708 of the housing 700 so that the arms 724 are located outside of the housing 700 when the contact 706 is loaded into the slot 708. The contact beams 812 and mounting body 900 may be a unitary body. By way of example only, the contact beams 812 and mounting body 900 may be stamped and formed from a common sheet of a conductive material. In the illustrated embodiment, the mounting body 900 is a substantially planar body with the mounting ends 710 and the contact beams 812 bent out of the plane defined by the mounting body 900. For example, the mounting ends 710 may be bent approximately ninety degrees out of the plane of the mounting body 900 and the contact beams 812 may be bent approximately ninety degrees out of the plane of the mounting body 900 in a different direction than the mounting ends 710.

A retention feature 902 protrudes, from one side of the mounting body 900 to secure the contact 706 in the housing 700. For example, the retention feature 902 may be a protrusion that engages, cuts into, or otherwise secures the contact 706 in the housing 700. The mounting body 900 includes a lower edge 904 that extends between the beams 812 in the illustrated embodiment. The lower edge 904 may engage or be engaged by the mating connector 612 (shown in FIG. 6) when the mating connector 612 is loaded into the connector assembly 602. For example, the mating edge 630 (shown in FIG. 6) of the mating connector 612 may abut the lower edge 904 of one or more of the contacts 706 when the mating connector 612 mates with the connector assembly 602.

As shown in FIG. 8, the contact beams 812 extend along the inner walls 802, 804 of the housing 700. In the illustrated embodiment, the contact beams 812 engage opposite sides 618, 620 (shown in FIG. 6) of the mating connector 612 (shown in FIG. 6) to electrically couple the contacts 706 with the mating connector 612. For example, the mating ends 906 of the contact beams 812 along the inner wall 802 may engage the mating pads 622 (shown in FIG. 6) on the side 618 of the mating connector 612 while the mating ends 906 of the contact beams 812 along the inner wall 804 may engage the mating pads 622 on the side 620 of the mating connector 612. The contact beams 812 include bends 814 that inwardly extend toward the opposing inner wall 802, 804. For example, the contact beams 812 disposed along the inner wall 802 may include bends 814 that extend toward the inner wall 804 and the contact beams 812 disposed along the inner wall 804 may include bends 814 that extend toward the inner wall 802. The bends 814 may provide a spring force that ensures engagement between the contact beams 812 and the mating pads 622 when the mating connector 612 is mated with the connector assembly 602.

Figure 10:
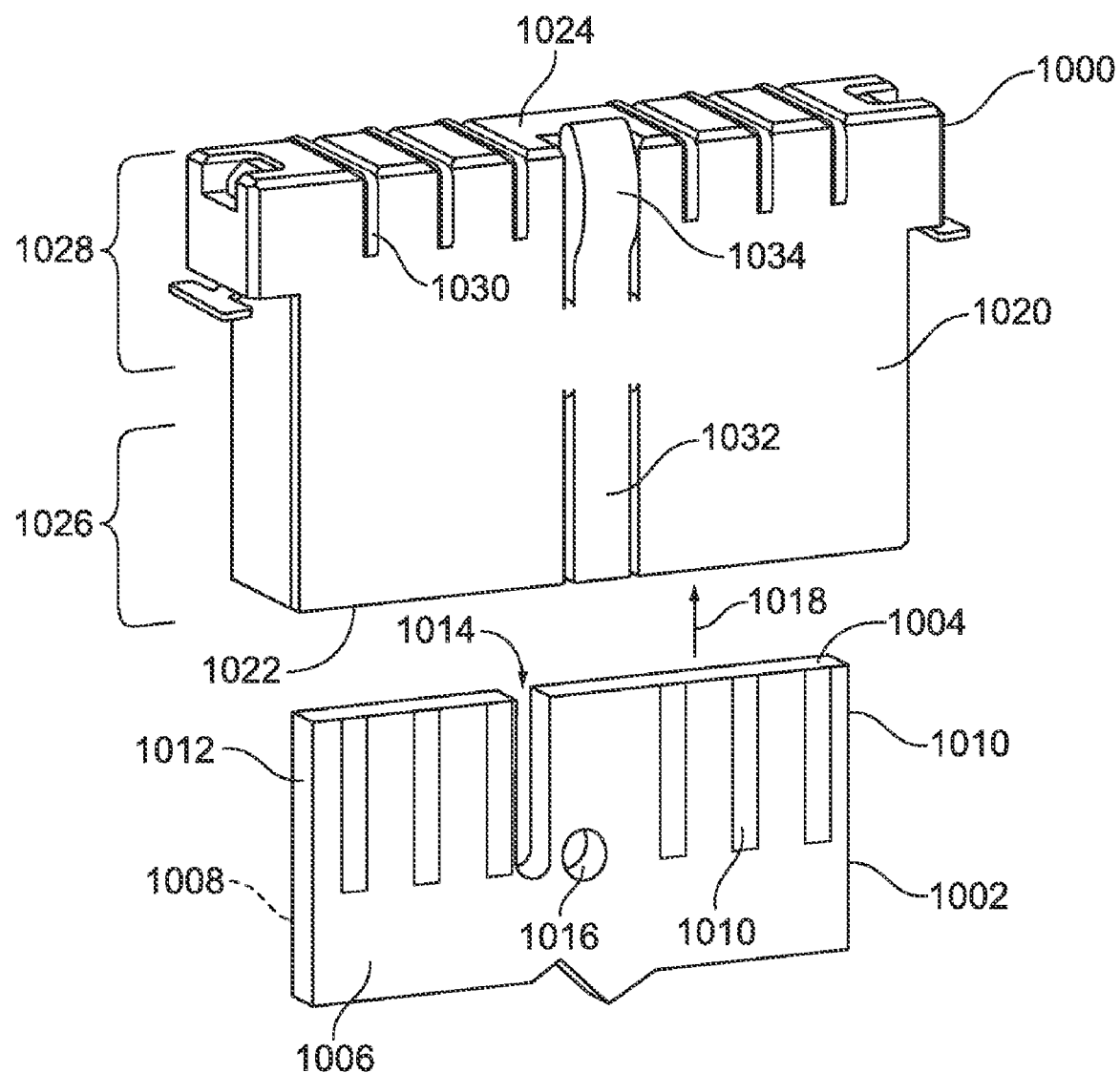
FIG. 10 is a perspective view of a connector assembly in accordance with another embodiment of the present disclosure.

FIG. 10 is a perspective view of a connector assembly 1000 in accordance with another embodiment of the present disclosure. The connector assembly 1000 may be similar to the connector assembly 602 (shown in FIG. 6). For example, the connector assembly 1000 may be a board-mounted connector that is mounted to a substrate such as the substrate 604 (shown in FIG. 1) such that the connector assembly 1000 at least partially protrudes through the opening 606 (shown in FIG. 6). The connector assembly 1000 includes a housing 1020 that extends from a front end 1022 to an opposite back end 1024. The housing 1020 may be at least partially divided into a protruding portion 1026 and a mounting portion 1028. The protruding and mounting portions 1026, 1028 may be similar to the protruding and mounting portions 738, 740 (shown in FIG. 7) of the connector assembly 602. The housing 1020 may include, or be formed from, a dielectric material, such as one or more polymer materials. The housing 1020 includes an interior chamber (not shown) that may be similar to the interior chamber 800 (shown in FIG. 8) of the connector assembly 602. Several contacts 1030 are joined to the housing 1020. The contacts 1030 include, or may be formed from, a conductive material such as a metal or metal alloy.

The connector assembly 1000 mates with a mating connector 1002. In the illustrated embodiment, the mating connector 1002 is a card module that is similar to the mating connector 612 (shown in FIG. 6). The interior chamber (not shown) of the housing 1020 receives the mating connector 1002. For example, the housing 1020 may include a card slot that inwardly extends from the front end 1022 toward the back end 1024 and that receives a card module. The mating connector 1002 includes a mating edge 1004 that is loaded into the connector assembly 1000. The mating connector 1002 includes opposite sides 1006, 1008. One or more of the sides 1006, 1008 has conductive mating pads 1010 that may be similar to the mating pads 622 (shown in FIG. 6). The mating connector 1002 includes opposite edges 1010, 1012 and a keying slot 1014 disposed between the edges 1010, 1012. In the illustrated embodiment, the edges 1010, 1012 are exterior edges. For example, in contrast to the edges 626, 628 (shown in FIG. 6) of the mating connector 612, the edges 1010, 1012 are disposed along the outer edges of the mating connector 1002. The keying slot 1014 is an opening through the mating connector 1002 that inwardly extends from the mating edge 1004. The keying slot 1014 may receive a keying feature (not shown) disposed within the connector assembly 1000 to properly orient the mating connector 1002 with respect to the connector assembly 1000. The mating connector 1002 may include a retention feature 1016 is engaged by the connector assembly 1000 to secure the mating connector 1002 in a mated relationship with the connector assembly 1000. In the illustrated embodiment, the retention feature 1016 is a through hole extending through the thickness of the mating connector 1002.

The mating connector 1002 is loaded into the connector assembly 1000 along a mating direction 1018 in a manner similar to the insertion of the mating connector 612 (shown in FIG. 1) into the connector assembly 602 (shown in FIG. 6). In the illustrated embodiment, the housing 1020 includes a latch 1032 that engages the retention feature 1016 of the mating connector 1002 to secure the mating connector 1002 and connector assembly 1000 together. An actuation pad 1034 may be depressed to cause the latch 1032 to outwardly bias. For example, the actuation pad 1034 may move the latch 1032 outward and release the mating connector 1002.

Figure 11:
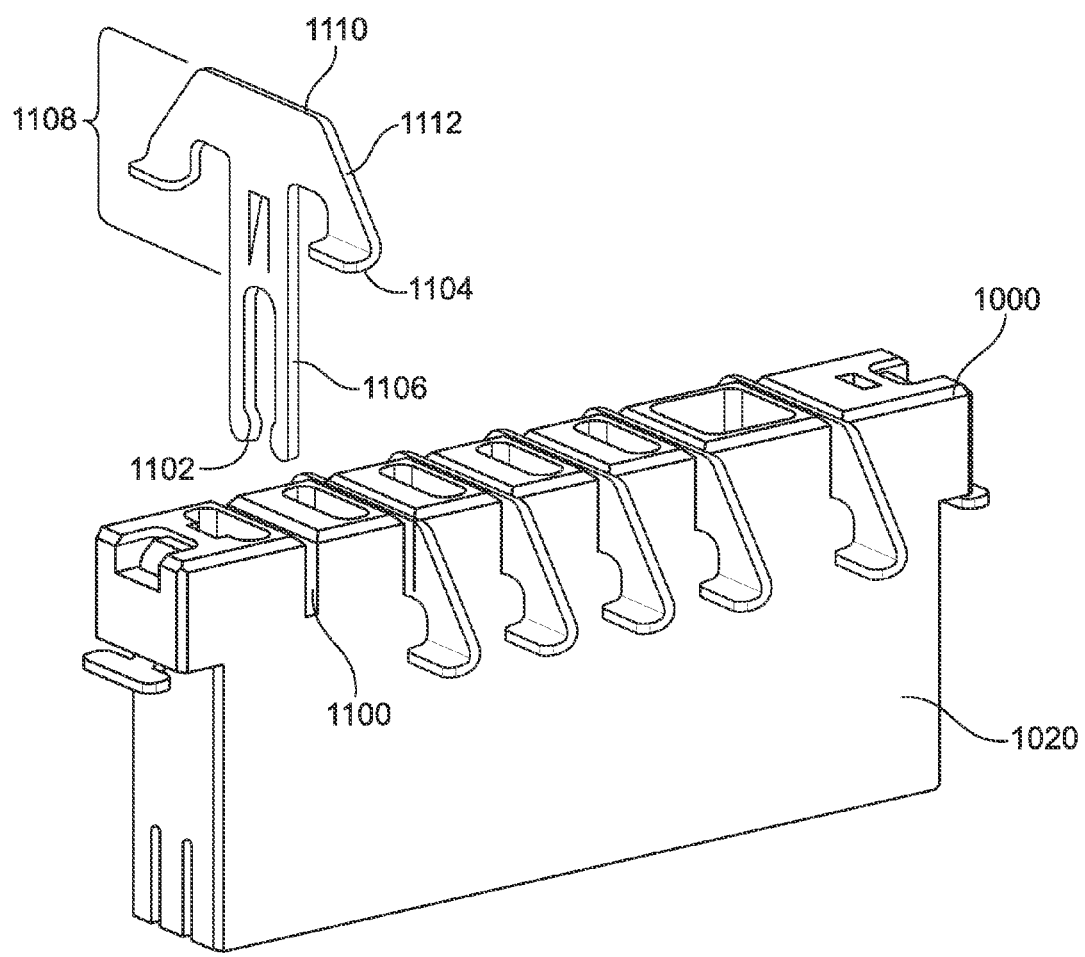
FIG. 11 is an exploded view of the connector assembly shown in FIG. 10 in accordance with one embodiment of the present disclosure.

FIG. 11 is an exploded view of the connector assembly 1000 in accordance with one embodiment of the present disclosure. Contacts 1110 in the connector assembly 1000 are similar to the contacts 1030 shown in FIG. 10. One difference between the contacts 1110 and the contacts 1030 is that the contacts 1110 include two arms 1112 that extend away from one another in opposite directions while the contacts 1030 include a single arm 1112 that is hidden from view in the perspective shown in FIG. 10. Similar to the housing 700 (shown in FIG. 7), the housing 1020 of the connector assembly 1000 includes contact slots 1100 that receive the contacts 1110 to position the contacts 1110 in the housing 1020. The contacts 1110 extend from mating ends 1102 to mounting ends 1104. The mounting ends 1104 may be similar to the mounting ends 710 (shown in FIG. 7) of the contacts 706 (shown in FIG. 7). The contacts 1110 include opposing contact beams 1106 that are joined to a mounting body 1108. The contact beams 1106 extend to the mating ends 1102 and the mounting body 1108 extends to the mounting ends 1104. The mounting body 1108 is loaded into the slot 1100 in the housing 1020. The contact beams 1106 and mounting body 1108 may be a unitary body in a mariner similar to the contacts 706. In contrast to the contacts 706, the mounting body 1108 may be a substantially planar body with the mounting ends 1104 bent out of the plane defined by the mounting body 1108 but with the contact beams 1106 being substantially coplanar with the mounting body 1108. Providing the contact beams 1106 in the same plane as the mounting body 1108 may permit more contacts 1110 to be placed into the housing 1020 when compared to the contacts 706.

The contact beams 1106 engage opposite sides 1006, 1008 (shown in FIG. 10) of the mating connector 1002 (shown in FIG. 10) to electrically couple the contacts 1110 with the mating connector 1002. The mating ends 1102 engage the mating pads 1010 (shown in FIG. 10) of the mating connector 1002 and the mounting ends 1104 engage the substrate (not shown) to which the connector assembly 1000 is mounted when the mating connector 1002 mates with the connector assembly 1000. The contacts 1110 electrically couple the mating connector 1002 with the substrate to which the connector assembly 1000 is mounted.

Various embodiments described herein provide for a low profile connector assembly that does not extend a considerable height above one side of a substrate to which the connector is mounted. Reducing the height at which the connector extends above at least one side of the substrate can be beneficial in applications where low profile con hectors are necessary. For example, in many lighting devices comprising a substrate, one or more LEDs and a connector configured to receive power for the LEDs, the connector must have a sufficiently low profile such that the connector and a corresponding mating connector do not interfere with the light emitted by the LEDs.

Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

What is claimed is:

1. A connector assembly comprising:
    a housing extending from a front end to an opposite back end and having opposite sides that extend from the front end to the back end, the housing including an interior chamber inwardly extending from the front end and configured to receive a mating connector through the front end of the housing, the housing further including an outwardly extending protrusion having a tab slot;
    a tab received in the tab slot of the protrusion and extending toward the front end of the housing to a housing mounting surface, the housing mounting surface mounted to a first side of a substrate; and
    a contact joined with the housing and extending between a mating end and a mounting surface of the contact, the contact including an arm disposed between a mounting body of the contact and the mounting surface, the arm extending through at least one of the opposite sides of the housing from the interior chamber of the housing to the mounting surface disposed outside of the housing, the mating end configured to engage a mating contact of the mating connector, the mounting surface configured to be mounted to the first side of the substrate to electrically couple the mating connector with the substrate, wherein the housing extends through an opening in the substrate such that the back end of the housing protrudes from the first side of the substrate and the front end of the housing protrudes from an opposite second side of the substrate.

2. The connector assembly of claim 1, wherein the mounting surface of the contact is mounted to the first side of the substrate and the front end of the housing outwardly protrudes from the second side of the substrate.

3. The connector assembly of claim 1, wherein the mounting surface of the contact is mounted to the first side of the substrate and the front end of the housing protrudes from the second side of the substrate, further wherein a distance between the mounting surface of the contact and the front end of the housing exceeds a distance between the mounting surface of the contact and the second side of the substrate from which the front end of the housing protrudes.

4. The connector assembly of claim 1, wherein the contact is mounted to the first side of the substrate and is decoupled from the second side of the substrate.

5. The connector assembly of claim 1, wherein first and second portions of the housing extend in opposite directions from one another and, when the housing is mounted to the substrate, the first portion extends from the first side of the substrate to the back end of the housing and the second portion extends from the second side of the substrate to the front end of the housing.

6. The connector assembly of claim 1, wherein, when the housing is mounted to the substrate, a total height dimension of the housing that extends from the front end to the back end is defined by non-overlapping first, second, and third distances, the first distance extending from the back end of the housing to first side of the substrate to which the contact is mounted, the second distance extending from the first side to the second side of the substrate, the third distance extending from the second side of the substrate to the front end of the housing.

7. The connector assembly of claim 1, wherein the mating end of the contact is disposed within the interior chamber of the housing.

8. The connector assembly of claim 1, wherein the housing includes a contact slot in the at least one of the opposite sides of the housing, the arm of the contact extending through the contact slot of the housing to outside of the housing.

9. A connector assembly comprising:
    a housing extending from a front end to an opposite back end and including opposite sides that extend between the front end and the back end, the housing including a card slot inwardly extending from the front end and disposed between the opposite sides, the card slot configured to receive a card module through the front end of the housing, the housing further including an outwardly extending protrusion having a tab slot;
    a tab received in the tab slot of the protrusion and extending toward the front end of the housing to a housing mounting surface, the housing mounting surface mounted to a first side of a substrate; and
    a contact joined with the housing and extending between a mating end and a mounting surface of the contact, the contact including an arm that protrudes through at least one of the opposite sides of the housing and interconnects the mating end with the mounting surface, the mating end configured to engage mating contacts on opposite sides of the card module, the mounting surface configured to be mounted to the first side of the substrate to electrically couple the card module with the substrate, wherein the housing extends through an opening in the substrate such that the back end of the housing protrudes from the first side of the substrate and the back end of the housing protrudes from an opposite second side of the substrate.

10. The connector assembly of claim 9, wherein the mating end of the contact comprises opposing contact beams configured to engage the mating contacts on the opposite sides of the card module.

11. The connector assembly of claim 9, wherein the housing receives the card module in a perpendicular relationship with respect to the substrate when the housing is mounted to the substrate.

12. The connector assembly of claim 9, wherein the mounting surface of the contact is configured to be mounted to the substrate outside of the housing and the mating end of the contact is disposed within the interior chamber.

13. The connector assembly of claim 9, wherein the housing comprises mounting tabs disposed between the front end and the back end of the housing, the mounting tabs configured to be mounted to the substrate to secure the housing to the substrate.

14. The connector assembly of claim 9, wherein first and second portions of the housing extend in opposite directions from one another and, when the housing is mounted to the substrate, the first portion extends from the first side of the substrate to the back end of the housing and the second portion extends from the second side of the substrate to the front end of the housing.

15. The connector assembly of claim 9, wherein the housing includes a contact slot in the at least one of the opposite sides of the housing, the arm of the contact extending through the contact slot from the card slot of the housing to outside of the housing.

16. The connector assembly of claim 9, wherein the arm of the contact is a first arm and the mounting surface of the contact is a first mounting surface, the contact further including a second mounting surface and a second arm that interconnects the second mounting surface with the mating end of the contact, the first arm and second arm extending in opposite directions from each other through the opposite sides of the housing to be mounted to the substrate.

17. The connector assembly of claim 9, wherein the contact is a unitary body that concurrently engages the mating contacts on the opposite sides of the card module.

18. A connector assembly comprising:
a housing extending from a front end to an opposite back end and having opposite sides that extend from the front end to the back end, the housing including an interior chamber inwardly extending from the front end and disposed between the opposite sides, the interior chamber configured to receive a mating connector through the front end of the housing; and
a contact joined with the housing and including arms extending between a mating end disposed within the interior chamber and mounting surfaces disposed outside of the housing, the mating end having opposing beams configured to engage mating contacts of the mating connector in the interior chamber, the mounting surfaces configured to be mounted to a first side of a substrate to electrically couple the mating connector with the substrate, the arms extending in opposite directions and protruding through the opposite sides of the housing, wherein the housing extends through an opening in the substrate such that the back end of the housing protrudes away from the first side of the substrate and the front end of the housing protrudes away from an opposite second side of the substrate.

19. The connector assembly of claim 18, wherein the mating connector that the interior chamber of the housing is configured to receive is a card module.

20. The connector assembly of claim 18, wherein the housing includes an outwardly extending protrusion having a tab slot, further comprising a tab received in the tab slot of the protrusion and extending toward the front end of the housing to a housing mounting surface, the housing mounting surface mounted to the first side of the substrate.

21. The connector assembly of claim 18, wherein the housing includes contact slots in the opposite sides of the housing, the arms of the contact extending through the contact slots from the interior chamber of the housing to outside of the housing.

22. The connector assembly of claim 18, wherein the mating connector is a card module and the contact is a unitary body with the opposing beams configured to concurrently engage the mating contacts on the opposite sides of the card module.

* * * * *